United States Patent [19]

Sawada

[11] Patent Number: 5,508,217
[45] Date of Patent: Apr. 16, 1996

[54] METHOD OF MANUFACTURING A VERTICAL FIELD EFFECT TRANSISTOR

[75] Inventor: Masami Sawada, Tokyo, Japan

[73] Assignee: NEC Corporation, Tokyo, Japan

[21] Appl. No.: 252,426

[22] Filed: Jun. 1, 1994

[30]    Foreign Application Priority Data

Jun. 1, 1993  [JP]  Japan ................................. 5-154281

[51] Int. Cl.$^6$ .................................................. H01L 21/266
[52] U.S. Cl. ............................. 437/40; 437/46; 437/149; 148/DIG. 126
[58] Field of Search .................... 437/28, 29, 40, 437/46, 149, 150, 247; 148/DIG. 126

[56]         References Cited

U.S. PATENT DOCUMENTS 4,914,047  4/1990  Seki ............................... 148/DIG. 126
5,306,654  4/1994  Kometani ..................... 148/DIG. 126

OTHER PUBLICATIONS

Ghandhi, "VLSI Fabrication Principles, Silicon & Gallium Arsenide", 1983, pp. 327–328.
Nonaka, Abstract of Japanese Unexamined Patent Publication Tokukaihei 1–260856, Oct. 1989.

Kunio, Abstract of Japanese Unexamined Patent Publication Tokukaihei 2–291174, Nov. 1990.

*Primary Examiner*—Chandra Chaudhari
*Attorney, Agent, or Firm*—Sughrue, Mion, Zinn, Macpeak & Seas

[57]          ABSTRACT

A vertical type field effect transistor includes N-type base regions formed on the surface of a P-type semiconductor substrate, a P-type source region formed in each of the N-type base regions, a gate insulating film formed between the P-type source regions, and a gate electrode formed of polysilicon on the gate insulating film. The transistor has the P-type source regions, the N-type base regions and a lower portion of the P-type semiconductor substrate as three terminals. A method for manufacturing the transistor comprises the steps of: forming the gate insulating film; growing a polysilicon layer; performing ion injection of an N-type impurity for the grown polysilicon layer; and performing heat treatment after the ion injection.

8 Claims, 6 Drawing Sheets

METHOD OF MANUFACTURING A VERTICAL FIELD EFFECT TRANSISTOR

BACKGROUND OF THE INVENTION

1. Field of the Invention

The present invention relates to a method for manufacturing a semiconductor device and more particularly to a method for manufacturing a vertical type MOS field effect transistor.

2. Description of Related Art

FIG. 1 is a cross sectional view showing the structure of a P channel vertical type field effect transistor. In the P channel vertical type field effect transistor shown in FIG. 1, there is used a $P^+$-type semiconductor substrate having a P-type semiconductor layer 2 formed thereon. On the surface of the P-type semiconductor layer 2 are formed N-type base regions 3 in each of which a $P^+$-type source region 4 is formed. A gate oxide film 5 is provided over the surfaces of a part of the $P^+$-type source region 4, the N-type base region 3, the P-type semiconductor layer 2, the N-type base region 3 and a part of the $P^+$-type source region 4. A polysilicon layer 6 is formed on the gate oxide film 5. The polysilicon layer 6 is covered with an insulating film 7 made of PSG (phosphor-silicate glass) on which metal such as aluminium is deposited to form a source electrode 8. Metal such as nickel is deposited on the back surface of the substrate 1 to form a drain electrode 9.

Generally, a few tens to a few hundred thousands of such a unit (cell) are arranged on a chip to form a device.

FIGS. 2A to 2E show a conventional manufacturing method of the P channel vertical type field effect transistor shown in FIG. 1.

First, as shown in FIG. 2A, the P-type epitaxial growth semiconductor layer 2 having a resistivity of 0.4 to 4.0 Ωcm and a thickness of 5 to 30 μm is formed on the $P^+$-type semiconductor substrate having a resistivity of about 0.01 Ωcm. Then, after a well region and a field oxide film region are formed, the gate oxide film 5 of 300 to 1000 Å in thick is formed on the surface of the P-type semiconductor layer 2. Next, as shown in FIG. 2B, a non-doped polysilicon layer 6 of 5000 to 10000 Å in thick is grown on the gate oxide film 5.

Next, as shown in FIG. 2C, the polysilicon layer 6 is etched by use of photolithography technology to form a gate electrode on which an oxide film 13 is grown for preventing a channeling phenomenon in ion injection. Then, phosphorus ions are injected in the semiconductor layer 2 with a dose amount of $1 \times 10^{12}$ to $8 \times 10^{13}$ cm$^{-2}$ and the acceleration voltage of 120 KeV in self-alignment with the etched polysilicon layer 6 as a mask. Subsequently, heat treatment is performed at 1140° C. for 100 to 400 minutes so that the N-type base region 3 is formed.

Next, as shown in FIG. 2D, another ion injection process for injecting $P^+$ ions is performed for back gate sections 11 of the N-type base region 3 after a resist 14 which has openings at the back gate sections 11. Thus, a contact characteristic with the source electrodes 4 which are formed in the following processes is improved. At this time, the $P^+$ ions are not injected in the polysilicon layer 6.

Subsequently, as shown in FIG. 2E, the photolithography technology is applied to the back gate section 11 such that it is covered with a resist 15. Then, boron ions are injected with a dose amount of $5 \times 10^{15}$ to $1 \times 10^{16}$ cm$^{-2}$ and the acceleration voltage of 50 KeV. After the resist 15 is removed, heat treatment is performed at a temperature of 850° to 900° C. for 10 to 60 minutes. At this time, the $P^+$-type source regions 4 are not only formed but also the polysilicon layer 6 is of $P^+$-type.

Next, as shown in FIG. 1, the PSG are deposited by a CVD method to form a PSG layer of 5000 to 10000 Å. An opening is formed in a part of the PSG layer by use of photolithography technology for forming a contact section and aluminium is deposited in the opening to form the source electrode 8. Thereafter, a metal such as nickel is deposited on the back surface of the substrate 1 to form the drain electrode 9.

For manufacturing the above semiconductor device, in the Japanese Unexamined Patent Publication Tokukaihei 1-260856, after a polysilicon layer 6 has been grown, the boron ion injection and subsequently the phosphorus ion injection are performed and then heat treatment is performed, as shown in FIG. 3A. In this example, boron ions diffuse toward the gate insulating film more than phosphorus ions do, so that the getter effect based on the phosphorus ions cannot be achieved sufficiently.

In addition, in the Japanese Unexamined Patent Publication Tokukaihei 2-291174, after the field oxide film is formed, phosphorus ion injection is performed and then boron ions are injected after patterning to make the polysilicon layer 6 to be of P-type, as shown in FIG. 3B. However, any heat treatment is not performed at all.

In the conventional methods mentioned above, the heat treatment after the boron ion injection causes the boron ions to diffuse from the polysilicon layer 6 toward the gate insulating film 5 and further to pass through the gate insulating layer 5. Therefore, there result in the low initial gate threshold voltage or the dispersion thereof, or low reliability which is considered to be directed because of generation of interface levels between the gate insulating film and the surface of the semiconductor device. Because the heat treatment is not performed after the phosphorus ion injection in the above Tokukaihei 2-29117, the phosphorus ions cannot be diffused sufficiently so that there is a lack of the capability of capturing movable ions such as Na ions and K ions in the vicinity of the gate insulating film, resulting in the problem of reliability and the problem on mass production.

SUMMARY OF THE INVENTION

The object of the present invention is to provide a method for manufacturing a semiconductor device having improved reliability and little lowering and dispersing of the gate threshold voltage in the semiconductor device with a P-type polysilicon gate electrode such as a P channel vertical type field effect transistor.

The present invention relates to a method for manufacturing a semiconductor device, and more particularly to a method for manufacturing a vertical type field effect transistor which includes N-type base regions formed on the surface of a P-type semiconductor substrate, a P-type source region formed in each of the N-type base regions, a gate insulating film formed between the P-type source regions, and a gate electrode formed of polysilicon on the gate insulating film, and has the P-type source regions, the N-type base regions and a lower portion of the P-type semiconductor substrate as three terminals. The present invention comprises the steps of: forming the gate insulating film; growing a polysilicon layer; performing ion injection of an N-type impurity for the grown polysilicon layer; and performing heat treatment after the ion injection.

As described above, according to the method for manufacturing the semiconductor device of the present invention, an N-type impurity is injected after the polysilicon layer is grown and then the subsequent strong heat treatment prevents the boron ions in the polysilicon layer from passing through the gate insulating film, so that the low value of initial gate threshold voltage and the dispersion thereof can be prevented. In addition, the semiconductor device can be provided in which the mass producibility is superior and the there can be prevented a low reliability because of the generation of interface levels. Further, the getter effect for movable ions such as Na ions can be achieved in maximum, resulting in the semiconductor device having instability in operation being eliminated.

DETAILED DESCRIPTION OF THE PREFERRED EMBODIMENTS

Figure 1:
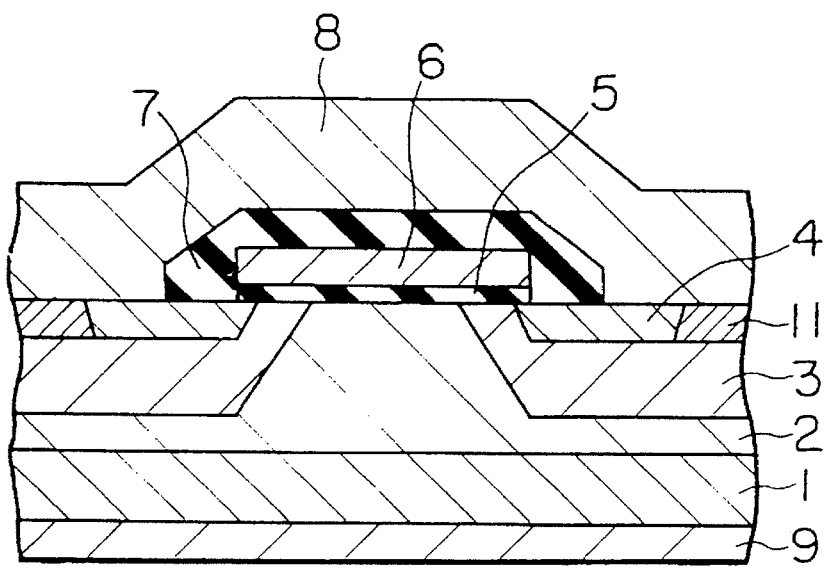
FIG. 1 is a cross sectional view showing a P channel vertical type field effect transistor.

The present invention will be described below in detail with reference to the accompanying drawings. An embodiment shown in FIGS. 4A to 4D is one when the method for manufacturing a semiconductor device of the present invention is applied to the P channel vertical type field effect transistor shown in FIG. 1.

Figure 4A:
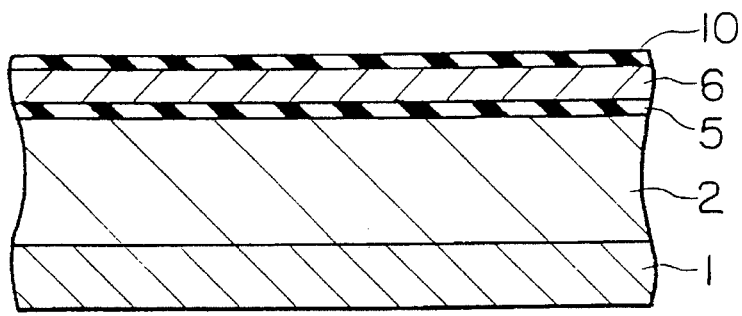
FIGS. 4A to 4D show a manufacturing method of the P channel vertical type field effect transistor according to an embodiment of the present invention.
Figure 4B:
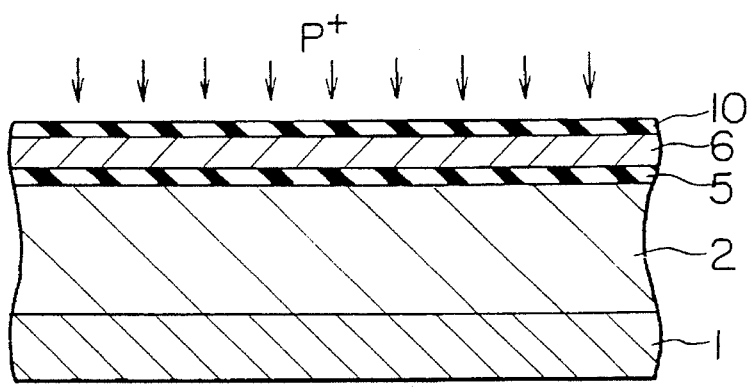

As shown in FIG. 4A, a P-type semiconductor layer 2 is epitaxially grown on a P-type semiconductor substrate 1, and a gate oxide film 5 of 300 to 1000 Å is formed on the semiconductor layer 2. On the gate oxide film 5 is formed a polysilicon layer 6 of 5000 to 10000 Å on which a thin oxide film 10 of about 200 Å is formed for preventing a channeling phenomenon in ion injection. Next, as shown in FIG. 4B, phosphorus ions are injected in the polysilicon layer 6 with the dose amount of $1\times10^{14}$ cm$^{-2}$ or more and the acceleration voltage of 80 KeV.

Figure 4C:
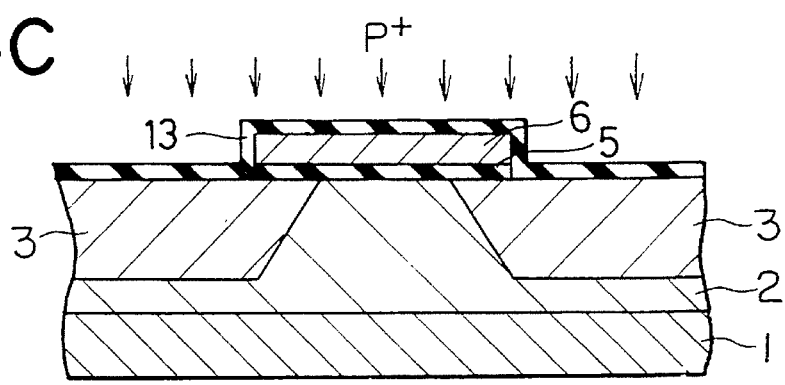

Next, as shown in FIG. 4C, the polysilicon layer 6 is etched and patterned by use of photolithography technology to form a gate electrode on which an oxide film 13 is grown for preventing a channeling in ion injection. Then, phosphorus ions are injected in the semiconductor layer 2 with the dose amount of $5\times10^{13}$ cm$^{-2}$ and the acceleration voltage of 120 keV in self-alignment with the formed gate electrode 6 as a mask. Subsequently, heat treatment is performed at 1100° C. or more for 180 minutes so that the N-type base regions 3 are formed. The phosphorus ions diffuse throughout the polysilicon gate electrode 6 by the heat treatment in the forming of the N-type base regions 3 because the phosphorus ion injection has been already performed as shown in FIG. 4B. However, the phosphorus ions do not pass through the gate oxide film. As a result, the polysilicon gate electrode is made to be of the N-type and the phosphorus ions reaches the gate oxide film 5 so that they acts as getters for movable ions such as sodium ion.

Figure 4D:
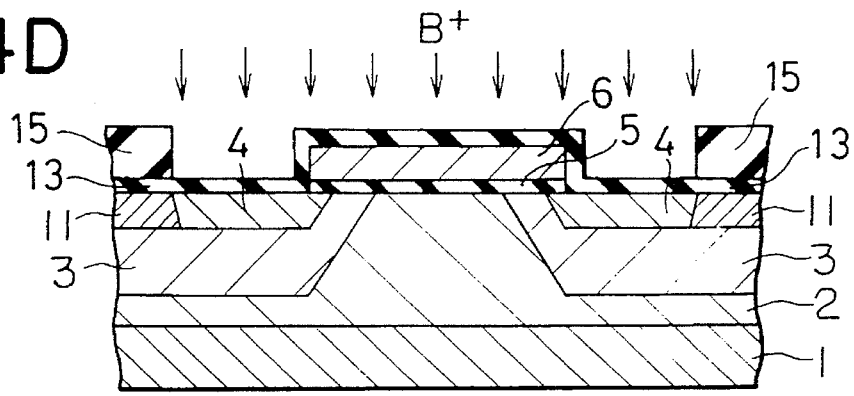

Next, as shown in FIG. 4D, a back gate section 11 is formed in the same manner as in the conventional method. Subsequently, the photolithography technology is applied to the back gate section 11 such that it is covered with a resist 15. Then, boron ions are injected with the dose amount of $5\times10^{15}$ to $1\times10^{16}$ cm$^{-2}$ and the acceleration voltage of 50 keV. After a resist is removed, heat treatment is performed at a temperature of 850° to 900° C. for 30 minutes. At this time, the P$^+$-type source regions 4 are not only formed but also the polysilicon layer 6 which is of the N-type before this ion injection is made to be of P$^+$-type. The following processes are performed in the same manner as in the conventional method shown in FIGS. 2A to 2D.

Figure 5:
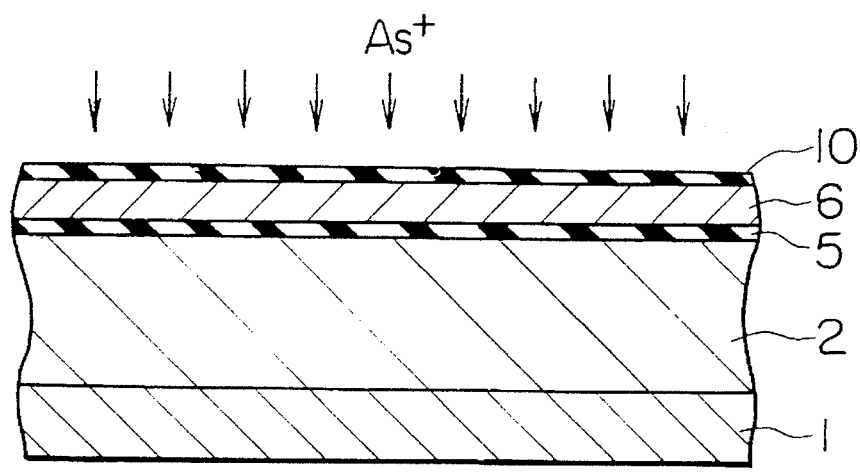
FIG. 5 shows another manufacturing method according to another embodiment of the present invention.
Figure 2A:
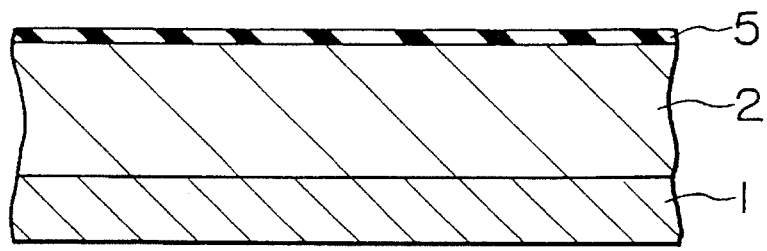
FIGS. 2A to 2E show a conventional manufacturing method of the P channel vertical type field effect transistor.
Figure 2B:
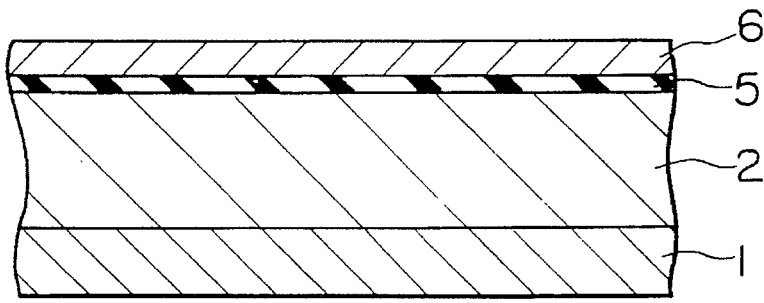
Figure 2C:
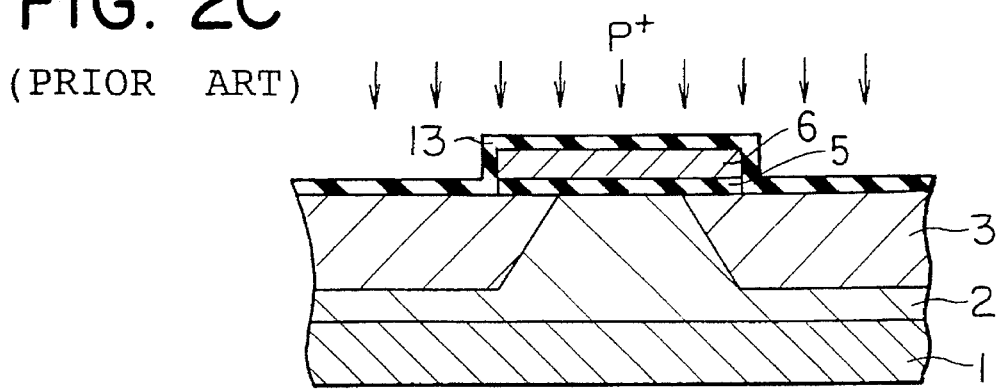
Figure 2D:
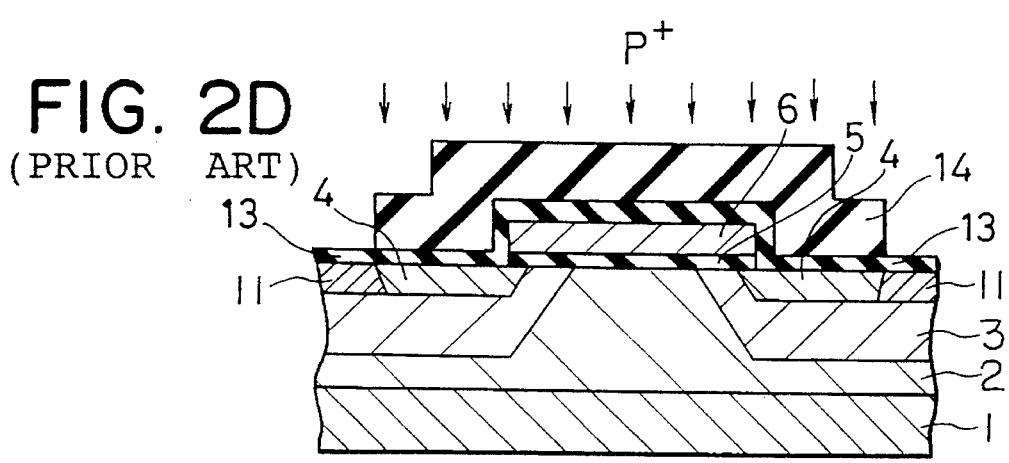
Figure 2E:
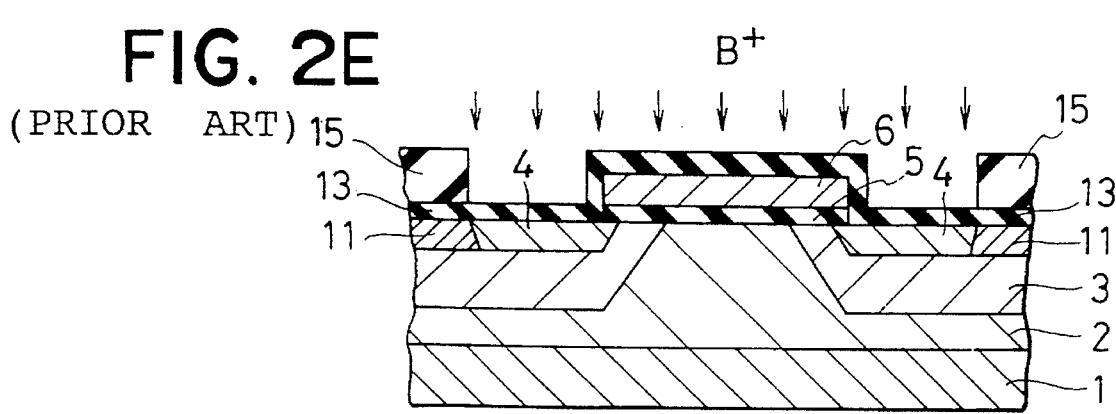
Figure 3A:
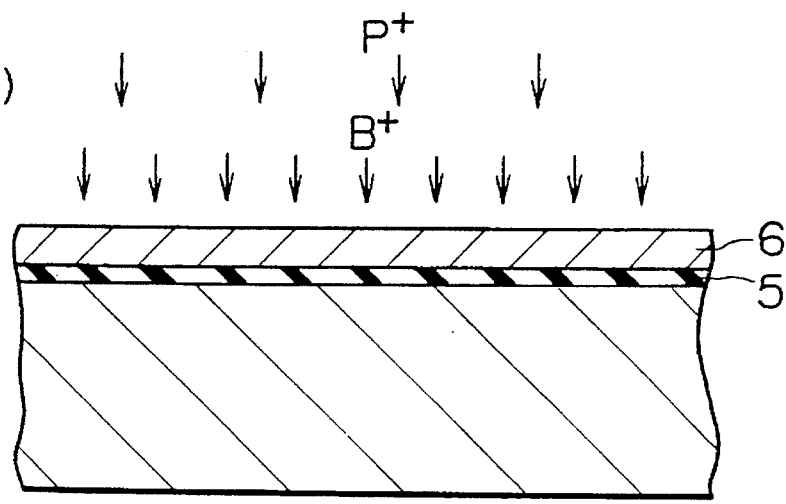
FIGS. 3A and 3B show other conventional manufacturing methods of the p channel vertical type field effect transistor.
Figure 3B:
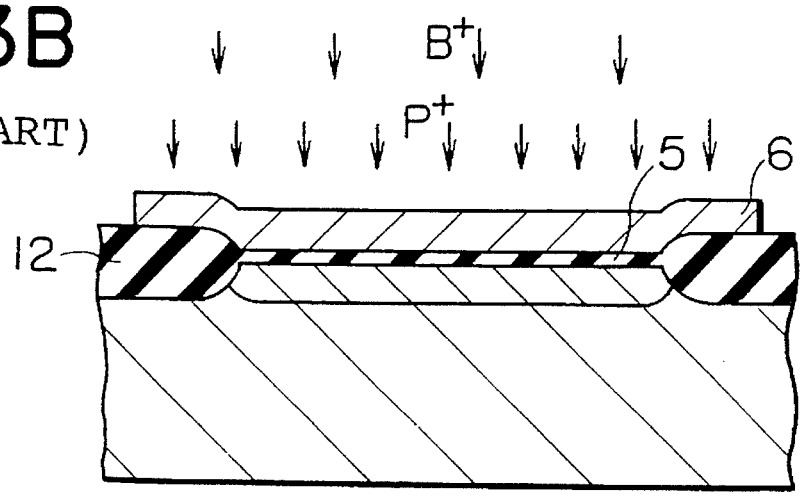

FIG. 5 shows a part of the semiconductor device manufacturing method according to another embodiment of the present invention. The phosphorus ions are injected in the polysilicon layer 6 in FIG. 4B. However, in this embodiment, arsenic ions are used as the same N-type impurity as the phosphorus ions in place of the phosphorus ions and the same effect can be obtained.

Figure 6A:
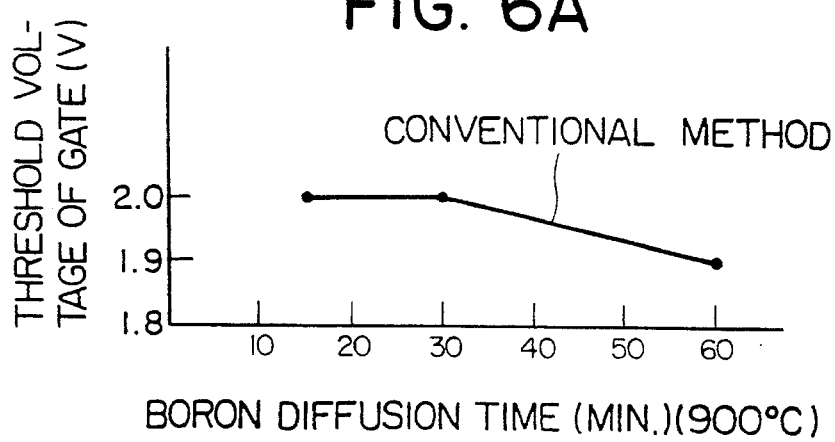
FIGS. 6A to 6C shows comparison results of the manufacturing method according to the present invention and a conventional method.
Figure 6B:
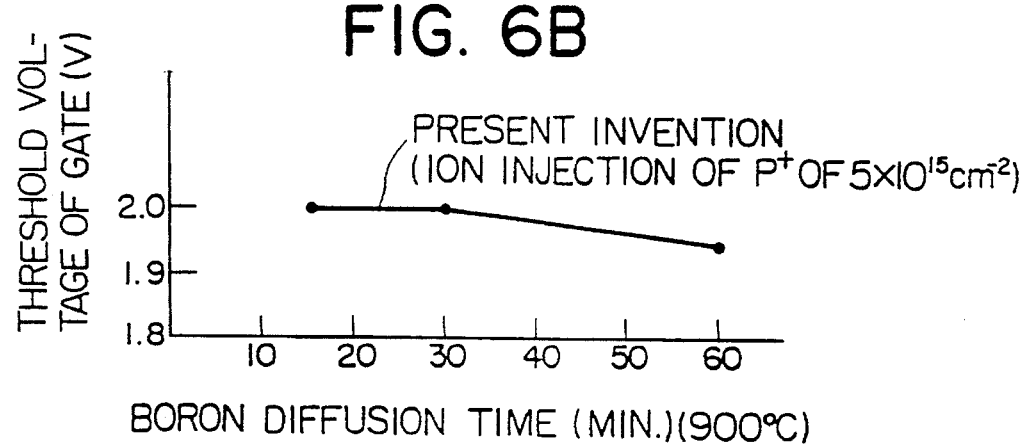
Figure 6C:
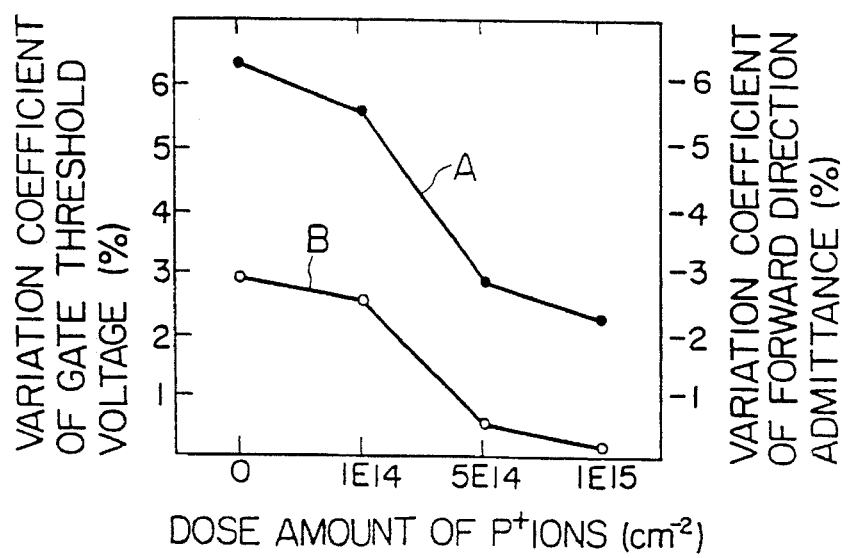

FIGS. 6a to 6C show the differences in the advantages between the semiconductor device manufacturing method according to the present invention and the conventional method.

FIGS. 6A and 6B show a dependency of a gate threshold voltage of the vertical type field effect transistor on the boron diffusion time into the source region. FIG. 6A shows the conventional method and FIG. 6B is the present invention. The axis of ordinate is the gate threshold voltage (V) and the axis of abscissa is the boron diffusion time (min.). It would be seen from these figures that the gate threshold voltage lowers remarkably on the diffusion for 60 minutes in the conventional method while it does not lower so much in the present invention.

FIG. 6C shows a dependency of the dose amount of N-type impurity and the changing rates of gate threshold voltage and forward admittance before and after the gate BT (bias—temperature) test for the vertical type field effect transistor. The axes of ordinates show the changing rate (%) of gate threshold voltage and forward admittance and the axis of abscissa shows the dose amount of P$^+$- ions as the N-type impurity. A curve A indicates the gate threshold voltage changing rate and a curve B indicates the forward admittance changing rate. It would be seen from the figure that the gate threshold voltage changing rate is +6.3% in the conventional method, i.e., when the P$^+$ ions are not injected, whereas it is improved to be +2.8% in the present invention. In addition, it would be also seen that the forward admittance changing rate is −2.8% in the conventional method, whereas it is −0.5% in the present invention (in the present invention P+ ions of $5\times10^{14}$ cm$^{-2}$ are injected in either case).

Thus, as should be seen from the figure, the dose amount of phosphorus ions is preferably more than $1\times10^{14}$ cm$^2$ and in this case the dose amount of boron ions is more than that of phosphorus ions.

What is claimed is:

1. A method for manufacturing a vertical type field effect transistor which includes N-type base regions formed on the surface of a P-type semiconductor substrate, a P-type source region formed in each of the N-type base regions, a gate insulating film formed between the P-type source regions, and a gate electrode formed of polysilicon on the gate insulating film, and has the P-type source regions, the N-type base regions and a lower portion of the P-type semiconductor substrate as three terminals, said method comprising the steps of:

forming the gate insulating film;

growing a polysilicon layer;

performing a first ion implantation of an N-type impurity to the grown polysilicon layer;

patterning said polysilicon layer into said gate electrode;

forming the N-type base regions by ion implantation of an N-type impurity into said semiconductor substrate using said gate electrode as a mask; and performing heat treatment after the ion implantation.

2. The method for manufacturing a vertical type field effect transistor according to claim 1, wherein said step of performing heat treatment includes performing heat treatment at a temperature of 1100° C. or more.

3. The method for manufacturing a vertical type field effect transistor according to claim 1, wherein said step of performing ion implantation includes performing ion implantation of an N-type impurity with the dose amount of $1 \times 10^{14}$ cm$^{-2}$ or more for the polysilicon layer.

4. The method for manufacturing a vertical type field effect transistor according to claim 1, which further comprises a step of performing a second ion implantation for doping a P-type impurity into said gate electrode and said semiconductor substrate at a greater doping amount than said N-type impurity of the first ion implantation, after said heat treatment process.

5. A method for manufacturing a semiconductor device, comprising the steps of:

forming a gate insulating film on a P-type semiconductor layer;

forming a polysilicon layer on the gate insulating film;

first doping an N-type impurity into said polysilicon layer;

patterning said polysilicon layer into a gate electrode;

second doping an N-type impurity into said gate electrode and said semiconductor layer;

making the N-type impurity doped in said gate electrode diffuse toward the gate insulating film, the N-type impurity doped in the gate electrode not passing through the gate insulating film; and doping a P-type impurity into said gate electrode after the diffusion to make said gate electrode to be of a P-type.

6. The method for manufacturing a semiconductor device according to claim 5, wherein said step of making the N-type impurity diffuse includes making the N-type impurity diffuse at a temperature of 1100° C. or more.

7. The method for manufacturing a semiconductor device according to claim 5, wherein said step of first doping an N-type impurity includes doping an N-type impurity with the dose amount of $1 \times 10^{14}$ cm$^{-2}$ or more into said polysilicon layer.

8. A method for manufacturing a semiconductor device, comprising the steps of:

forming a gate insulating film on a semiconductor substrate;

growing a polysilicon layer on said gate insulating film;

performing ion implantation of an N-type impurity with the dose amount of $1 \times 10^{14}$ cm$^{-2}$ or more to said polysilicon layer;

patterning said polysilicon layer into a gate electrode after said ion implantation of an N-type impurity;

forming an N-type base region by ion implantation of an N-type impurity into said semiconductor substrate using said gate electrode as a mask;

performing heat treatment at a temperature of 1100° C. or more, after said step of forming an N-type base region;

performing ion implantation, after said heat treatment process, for doping P-type impurity into said gate electrode and said semiconductor substrate at a greater doping amount than said N-type impurity implanted into said polysilicon layer.

* * * * *